(12) United States Patent
Vaez-Iravani et al.

(10) Patent No.: US 12,276,490 B2
(45) Date of Patent: Apr. 15, 2025

(54) SYSTEM AND METHOD TO MAP THICKNESS VARIATIONS OF SUBSTRATES IN MANUFACTURING SYSTEMS

(71) Applicant: Applied Materials, Inc., Santa Clara, CA (US)

(72) Inventors: Mehdi Vaez-Iravani, Los Gatos, CA (US); Todd J. Egan, Fremont, CA (US); Gopalakrishna B. Prabhu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 157 days.

(21) Appl. No.: 17/860,335

(22) Filed: Jul. 8, 2022

(65) Prior Publication Data

US 2023/0011748 A1 Jan. 12, 2023

Related U.S. Application Data

(60) Provisional application No. 63/203,186, filed on Jul. 12, 2021.

(51) Int. Cl.
*G01B 11/06* (2006.01)
*C23C 14/54* (2006.01)
*C23C 14/58* (2006.01)

(52) U.S. Cl.
CPC ........ *G01B 11/0675* (2013.01); *C23C 14/547* (2013.01); *C23C 14/588* (2013.01); *G01B 11/0683* (2013.01)

(58) Field of Classification Search
CPC ............ G01B 11/0675; G01B 11/0683; G01B 11/0633; G01B 2210/56; C23C 14/547; C23C 14/588; H01L 22/12
See application file for complete search history.

(56) References Cited

U.S. PATENT DOCUMENTS

| | | | | |
|---|---|---|---|---|
| 2002/0057437 A1* | 5/2002 | McMillen | .......... | G01B 11/0625 356/504 |
| 2006/0279744 A1* | 12/2006 | Takeda | ............... | G01B 11/0683 356/503 |
| 2012/0084045 A1* | 4/2012 | Koshimizu | ........ | G01B 11/0675 702/134 |
| 2018/0304435 A1* | 10/2018 | Xu | ........................... | G06N 3/08 |

(Continued)

FOREIGN PATENT DOCUMENTS

| | | | |
|---|---|---|---|
| JP | 2001091221 A | | 4/2001 |
| JP | 2008506952 A | | 3/2008 |

(Continued)

OTHER PUBLICATIONS

International Search Report and Written Opinion for International Application No. PCT/US2022/036721, mailed Oct. 25, 2022, 12 pages.

*Primary Examiner* — Tarifur R Chowdhury
*Assistant Examiner* — Akbar H. Rizvi
(74) *Attorney, Agent, or Firm* — Lowenstein Sandler LLP

(57) ABSTRACT

Implementations disclosed describe, among other things, a system and a method of scanning a substrate with a beam of light and detecting for each of a set of locations of the substrate, a respective one of a set of intensity values associated with a beam of light reflected from (or transmitted through) the substrate. The detected intensity values are used to determine a profile of a thickness of the substrate.

24 Claims, 8 Drawing Sheets

(56) References Cited

U.S. PATENT DOCUMENTS

| | | | |
|---|---|---|---|
| 2019/0022820 A1* | 1/2019 | Kimba | B24B 49/12 |
| 2019/0293407 A1* | 9/2019 | Tahara | H04B 10/64 |
| 2020/0103220 A1* | 4/2020 | Kimura | H01L 21/67253 |

FOREIGN PATENT DOCUMENTS

| | | |
|---|---|---|
| JP | 2012173296 A | 9/2012 |
| KR | 2000-0048393 A | 7/2000 |
| KR | 20090046566 A | 5/2009 |

* cited by examiner

SYSTEM AND METHOD TO MAP THICKNESS VARIATIONS OF SUBSTRATES IN MANUFACTURING SYSTEMS

RELATED APPLICATION

This application claims the benefit of U.S. Provisional Application No. 63/203,186, filed Jul. 12, 2021, the entire content of which is hereby incorporated by reference.

TECHNICAL FIELD

This instant specification generally relates to ensuring quality control of materials manufactured in substrate processing systems. More specifically, the instant specification relates to optical inspection of variations in thickness of substrates during various stages of the manufacturing process.

BACKGROUND

Manufacturing of modern materials often involves various deposition techniques, such as chemical vapor deposition (CVD) or physical vapor deposition (PVD) techniques, in which atoms of one or more selected types are deposited on a substrate (wafer) held in low or high vacuum environments that are provided by vacuum deposition chambers. Materials manufactured in this manner may include monocrystals, semiconductor films, fine coatings, and numerous other substances used in practical applications, such as electronic device manufacturing. Many of these applications rely on the purity of the materials grown in substrate processing systems. The need to maintain isolation of the inter-chamber environment and to minimize its exposure to ambient atmosphere and contaminants therein gives rise to various robotic techniques of sample manipulation and inspection. Improving precision, reliability, and efficiency of such robotic techniques presents a number of technological challenges whose successful resolution facilitates continuing progress of electronic device manufacturing. This is especially applicable given that the demands to the quality of chamber manufacturing products are constantly increasing.

DETAILED DESCRIPTION

Figure 1:
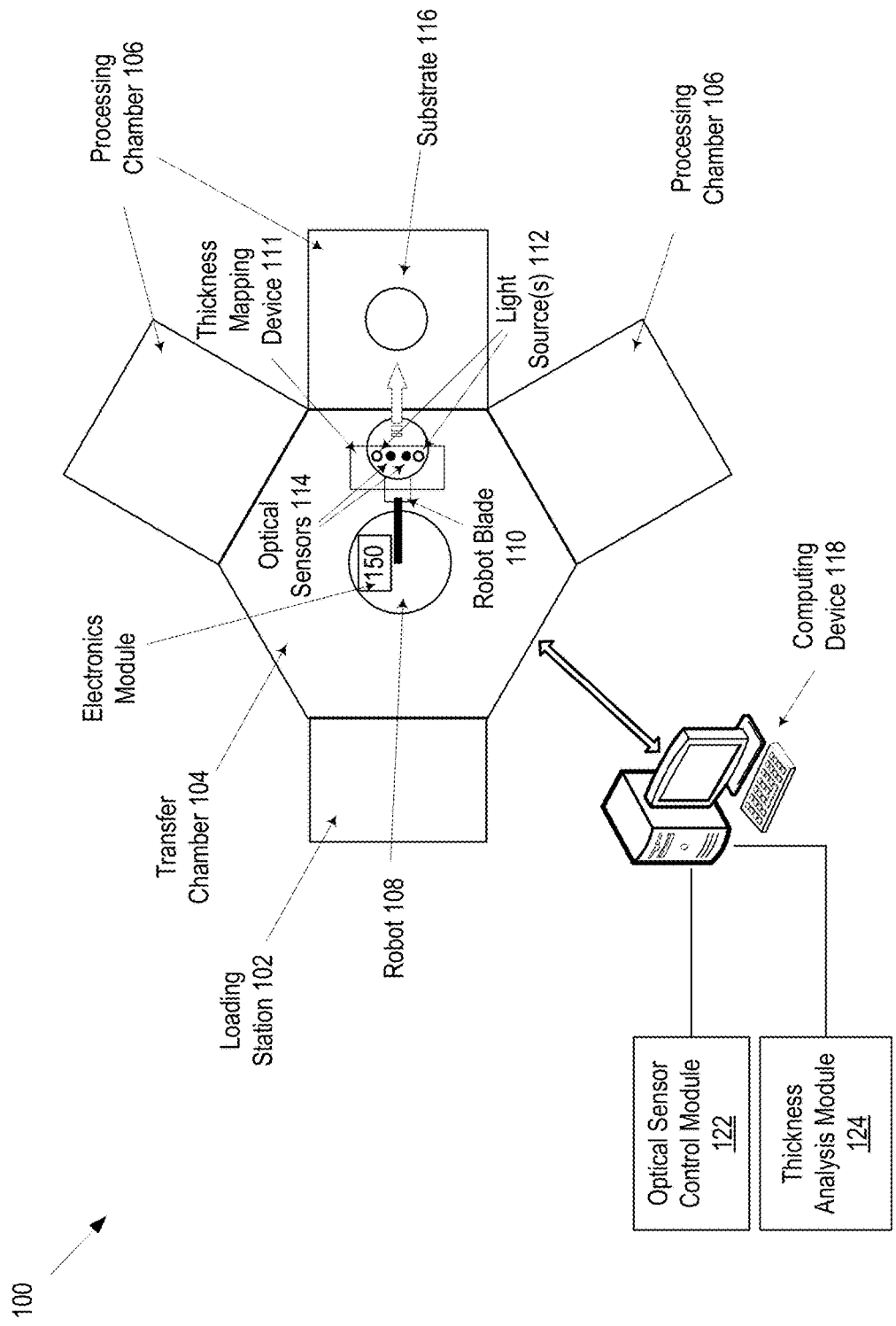
FIG. 1 illustrates one exemplary embodiment of a manufacturing machine capable of supporting efficient thickness variation metrology of substrates processed therein, according to one embodiment.

The embodiments disclosed herein provide for optical mapping of thickness variations of substrates and wafers due to non-uniformities resulting from wafer manufacturing processes including polishing, etching, material deposition, and the like to smooth, add, and/or remove material. For example, the embodiments disclosed may enable to determine metrology of wafer thicknesses using methods that may be integrated into larger processing tools, such as chemical-mechanical polishing (CMP). For example, metrology of wafers may include determining a variation of a thickness profile resulting from deposition and/or etching operations. In some embodiments, the deposition may include epitaxial silicon carbide (SiC) deposition, which may happen after CMP. Further, once the thickness variation profile is known, the metrology data may indicate how to best correct undesirable thickness variations and create as uniform a surface as possible (or achieve other target thickness variations as may be specified by a technological process being performed). For example, the thickness variation profile may be used in a feedback process within a processing chamber to further add or remove material, such as a transparent film or the like, from the substrate as necessary.

Precise thickness metrology may be useful in many disciplines of technical and commercial interest, including production of flat semiconductor wafers (e.g., optical flats). During the manufacturing process of optical flats and semiconductor wafers, thickness non-uniformities may occur in the range of a few microns. Further, the variation in the thickness of a wafer typically has a low spatial frequency across the wafer. In some embodiments, an objective of thickness metrology of a semiconductor wafer, e.g., a transparent semiconductor wafer, is not the absolute thickness itself, but rather the variation in the thickness across the wafer, since the absolute thickness may be controlled to within a few microns. For example, in some manufacturing operations (e.g., CMP operations) performed on semiconductor wafers, the intent may be to produce a wafer that is as flat and uniform as possible.

Accordingly, it may be advantageous to have information regarding thickness variations of the surface, which can relate to its quality, roughness, and so on, before a manufacturing process is complete, to enable correcting processing errors and imperfections while a sample is still inside the processing system. In some embodiments, the target surface may have a complicated profile that includes a number of ridges, recesses, kinks, grooves, flat regions, rounded regions, and so on. For example, a thickness profile of the wafer surface may be represented by a dependence of a height (width, depth) of the target surface h(x,y), counted from some reference surface (e.g., a horizontal or a vertical plane), on the coordinates (e.g., x,y) along this reference surface. The profile may be characterized by a discrete (or a quasi-continuous) set of locations with the resolution determined by a spacing (e.g., $\Delta x, \Delta y$) between adjacent locations. The spacing may be pre-set based on the desired resolution of the target surface imaging.

Existing techniques to perform precise thickness metrology may include the use of capacitive probes, confocal microscopes, interferometric methods, and the like, each of which have their respective advantages and disadvantages when applied to specific use cases. For example, interferometric techniques (both absolute and differential) may provide good sensitivity for both large and small substrates and have been implemented with varying degrees of success.

In many cases, however, optical techniques to perform thickness metrology (also referred to as wafer-shape metrology) often require measurements of two surfaces individually to obtain two separate maps; comparison of such maps allows to determine variations in wafer thicknesses. Such a method requires an elaborate setup in which the proper operation depends on referencing the optical flats which need to be held precisely with respect to the semiconductor wafer in a highly stabilized environment. It can, therefore, be both time-consuming and expensive to constantly monitor and map thickness variations. Such a stand-alone and highly optimized setup may not be desirable, especially in the case where on-board metrology is required.

Aspects and embodiments of the present disclosure address these and other shortcomings of the existing technology. Described herein is a method and setup for efficient optical thickness metrology of substrates. This facilitates compact, stable, and affordable data acquisition that may provide high-sensitivity and high-resolution information about the efficacy of a technological process, such as deposition (such as epitaxial silicon carbide (SiC) deposition, which may happen after CMP), etching, CMP, or any other manufacturing process. Further, the solution may be implemented as an on-board metrology system.

During manufacturing processes that involve optical flats and semiconductor wafers, thickness non-uniformities may occur in the range of a several microns. Further, the variation in the thickness of a wafer typically has a low spatial frequency across the wafer. Thus, assuming that the wafer of interest is transparent at a particular wavelength of electromagnetic radiation (such as optical wavelengths), passage of any coherent radiation through the wafer occurs with multiple internal reflections. Such phenomena may be used to implement an etalon-type interferometer, which may be applied to map thickness variations across the surface of the wafer.

The disclosed embodiments pertain to a variety of manufacturing techniques that use processing chambers (that may include deposition chambers, etching chambers, and the like), such as chemical mechanical polishing (CMP) techniques, chemical vapor deposition techniques (CVD), physical vapor deposition (PVD), plasma-enhanced CVD, plasma-enhanced PVD, sputter deposition, atomic layer CVD, combustion CVD, catalytic CVD, evaporation deposition, molecular-beam epitaxy techniques, and so on. Although the most significant practical impact of the disclosed embodiments may be expected to occur in techniques that use vacuum deposition chambers (e.g., ultrahigh vacuum CVD or PVD, low-pressure CVD, etc.), the same systems and methods may be utilized in atmospheric pressure deposition chambers for non-intrusive monitoring of the chamber conditions that exist during deposition processes.

FIG. 1 illustrates one exemplary embodiment of a manufacturing machine 100 capable of supporting efficient thickness variation metrology of substrates processed therein, according to one embodiment. In one embodiment, the manufacturing machine 100 includes a loading station 102, a transfer chamber 104, and one or more processing chambers 106. The processing chamber(s) 106 may be interfaced to the transfer chamber 104 via transfer ports (not shown). The number of processing chamber(s) associated with the transfer chamber 104 may vary (with three processing chambers indicated in FIG. 1 as a way of example). The transfer chamber 104 may include a robot 108, a robot blade 110 to support a substrate (e.g., a wafer or a transparent wafer), light source(s) 112 for scanning of a substrate 116 (e.g., a target), and optical sensors 114 located in one of the processing chambers 106. The light source(s) 112 and the optical sensors 114 may be part of a thickness mapping device 111. The transfer chamber 104 may be held under pressure (temperature) that is higher (or lower) than the atmospheric pressure (temperature).

The robot 108 may transfer various products and devices (e.g., semiconductor wafers, substrates, liquid crystal displays, reticles, calibration devices) between the load station 102 and one of the processing chambers 106.

In one embodiment, robot blade 110 of the robot 108 supports the substrate 116 when the latter is transferred into one of the processing chambers 106. The robot blade 110 may be attached to an extendable arm sufficient to reach between different chambers. The light source(s) 112 may scan the substrate 116 with one or more beams of light to obtain intensity values caused by reflection of the one or more beams of light from the substrate 116. The substrate 116 may be a wafer, a substrate chuck, an edge ring, or any other object/tool located in one of the processing chambers 106 (or in the loading station 102, the transfer chamber 104, the ports connecting the transfer chamber 104 to the loading station 102 or the processing chambers 106). The reflected beams of light may be received by one or more optical sensors 114. The thickness mapping device 111 may include an alignment point in order to be properly aligned relative to the substrate 116. The alignment point may be a hole, notch, or indent and may be centered in a pocket or depression of the robot blade 110. The optical sensors 114 of the thickness mapping device 111 may be capable of sensing visible light or other electromagnetic radiation coming from the target surface (e.g. reflected by that surface) of the substrate 116. The light detected by the optical sensors 114 may be reflected from the target surface where the light may be directed by one or more light sources 112. In some embodiments, the light sources 112 may be mounted on the same thickness mapping device 111. In other embodiments, the light sources 112 may be located outside the thickness mapping device 111, e.g., mounted inside the transfer chamber 104, the loading station 102 or the processing chambers 106. The robot blade 110 may deliver (and retrieve) substrates to (and from) the processing chamber(s) 106 through a slit valve port (not shown) while a lid to the processing chamber(s) 106 remains closed. The processing chamber(s) 106 may contain processing gases, plasma, and various particles used in deposition processes. A magnetic field may exist inside the processing chamber(s) 106. The inside of the processing chamber(s) 106 may be held at temperatures and pressures that are different from the temperature and pressure outside the processing chamber(s) 106. The temperatures and pressures inside the processing chamber(s) 106 may be similar to those that correspond to the actual online processing conditions. Although the substrate 116 is shown as being supported and moved by the robot blade 110 of the robot 108, in other embodiments, the substrate 116 may be moved using a dedicated motion stage or any other suitable movable stage, an existing substrate transfer mechanism, an existing motion mechanism in a process chamber (such as a polishing head or another wafer deployed in a CMP process).

A computing device 118 may include an optical sensor control module 122 and the thickness analysis module 124. The optical sensor control module 122 may control operations of the optical sensors 114 and in some cases the light source(s) 112. The thickness analysis module 124 may receive intensity values measured by the optical sensors 114 and determine a thickness variation map of the substrate 116.

The electronics module 150 may be capable of facilitating wireless thickness variation mapping of targets inside the manufacturing machine 100 to determine profile data corresponding to thickness variations of the substrate, in one exemplary embodiment. The electronics module 150 may include a microcontroller and a memory buffer coupled to the microcontroller. The memory buffer may be used to collect and store data before transmitting the data to the computing device 118. In some embodiments, the data may be transmitted using a wireless communication circuit. In other embodiments, the data may be transmitted using a wired connection between the electronics module 150 and the computing device 118. In some embodiments, the data may first be stored (buffered) in the memory buffer prior to being transmitted to the computing device 118. In other embodiments, the data may be transmitted to the computing device 118 as the data is collected, without being stored in the memory buffer. In some embodiments, the wireless or wired connection may be continuous. In other embodiments, the wireless or wired connection may be established periodically or upon completion of the inspection or some other triggering event (e.g., when the memory buffer is close to being full). The electronics module 150 may further include a power element and a power-up circuit. In some embodiments, the power element may be a battery. In some embodiments, the power element may be a capacitor. The power element may be rechargeable from a power station. The microcontroller may be coupled to one or more optical sensors 114. The optical sensor 114 may include a light source and a light detector. The electronics module 150 may also include an accelerometer to facilitate accurate extension and angular rotation of the robot blade 110. The electronics module 150 may also include a temperature sensor to detect temperature near the substrate 116.

The electronics module 150 may further include a wireless communication circuit, i.e. a radio circuitry for receiving wireless instructions from the computing device 118 and for transmitting intensity values to the computing device 118. For example, the radio circuitry may include an RF front end module and an antenna (e.g., a UHF antenna), which may be an internal ceramic antenna, in one embodiment. The batteries may be of a high temperature-tolerant type such as lithium ion batteries that may be exposed to a chamber temperature of 450 degrees C. for a short time period such as one to eight minutes.

Some components may be located on or at the stationary part of the robot 108. For example, the microcontroller, the memory buffer, and the RF front end may be so located. Other components of the electronics module 150 may be located on or at the robot blade 110 of the robot 108 and or the thickness mapping device supported by the robot blade. The robot blade may be movable to support a substrate, which may be transported by the robot blade. For example, the optical sensors 114, the accelerometer, and the temperature sensor may be so located. In some embodiments, some of the components of the electronics module 150 may be located both at the stationary part of the robot 108 and the extendable robot blade 110, e.g., power element may be so located. In some embodiments, two separate microcontrollers may be implemented, with one of the microcontrollers located on the stationary part of the robot 108 and the other microcontroller located on the thickness mapping device 111.

The wireless connection facilitated by the RF front end and antenna may support a communication link between the microcontroller and the computing device 118, in some embodiments. In some embodiments, the microcontroller integrated with the robot 108 may have a minimal computational functionality sufficient to communicate information to the computing device 118, where most of the processing of information may occur. In other embodiments, the microcontroller may carry out a significant portion of computations, while the computing device 118 may provide computational support for specific, processing-intensive tasks. Data received by the computing device 118 may be data obtained from the inside of the transfer chamber 104, the processing chambers 106, data collected by the optical sensors 114, data temporarily or permanently stored in the memory buffer, and so on. The data stored in the memory buffer and/or transmitted to or from the computing device 118 may be in a raw or processed format.

In one embodiment, thickness mapping device may determine and output (using the processing capabilities of the microcontroller and/or the computing device 118) profile data characterizing a thickness variation of the substrate based on intensity values associated with one or more received beams of light. The one or more received beams of light may be caused by interaction or one or more incident beams of light on the substrate due to scanning the substrate with the one or more incident beams of light. The intensity values may originate from one or more locations of the substrate.

For example, the thickness mapping device 111 may scan the substrate with a first beam of light from the light source(s) 112. The thickness mapping device 111 may obtain intensity values associated with a second beam of light corresponding to one or more locations of the substrate. The second beam of light may be caused by interaction of the first beam of light with the substrate. The interaction may include reflection or transmission of the first (incident) beam of light with the substrate. Accordingly, the second beam of light may be a reflected beam or a transmitted beam. The thickness mapping device 111 may determine profile data characterizing a thickness variation of the substrate using the obtained intensity values. In some instances, during processing stages of the substrate, such as deposition, etching, polishing, etc., a slurry may be formed (which may include beads of water and/or other material used in the processing) that is detrimental to accuracy of optical measurements and thickness mapping. To remove residual water, in some embodiments a directed gas source (e.g., a jet of gas), such as nitrogen, argon, xenon, air, and the like may be applied to dry the substrate prior to scanning with a beam of light in order to minimize optical effects of such extraneous material and ensure accuracy of the determined profile data.

A plurality of intensity values may be determined for the substrate. In some embodiments, where thickness mapping is performed using reflected light, the intensity values may be representative of a reflectance of the substrate at various locations. In some embodiments, where thickness mapping is performed using transmitted light, the intensity values may be representative of the transmittance of the substrate at various locations. Since light reflected from the top surface of the substrate and the light reflected from the bottom surface may interfere, the reflectance and/or transmittance may display a series of bright (maxima) and dark (minima) interference fringes. Such interference fringes, as described in more detail below, may be used as benchmarks for determining thickness (and/or thickness variations) of the substrate. In particular, intensity values may include at least a first intensity value from a first location of the one or more locations and a second intensity value from a second location of the one or more locations. The profile data may identify thickness changes of the substrate between the first location and the second location using the first intensity value and the second intensity value.

Because reflectance (and/or transmittance) may be a periodic function of the thickness of the substrate, in some cases there may be some ambiguity regarding whether the thickness is increasing or decreasing between the first location and the second location. For example, intensity $I=f(d;\lambda,\theta)$ of a reflected (or transmitted) beam of light, for a given wavelength $\lambda$ and angle of incidence $\theta$, may include a number of interference maxima and minima with respect to varying thickness d of the substrate. As a result, when a first intensity value, e.g., $I_1=f(d_1;\lambda_1,\theta_1)$, determined at a first location, is near a maximum (or minimum) of the function $f$, a lower (or higher) second intensity value, e.g., $I_2=f(d_2;\lambda_1,\theta_1)$ may not fully determine whether the thickness of the substrate is increasing ($d_2>d_1$) or decreasing ($d_1>d_2$) between the first location and the second location. In such cases, the thickness mapping device 111 may scan the substrate with an additional beam of light (e.g., a third beam of light) from the same or other light source(s) 112. The third beam of light may be different from the first beam of light by at least one of a wavelength (e.g., $\lambda_2$) or an angle (e.g., $\theta_2$) of incidence on the substrate. For example, in one embodiment, there may be two (or more) light sources 112, each source producing a beam of light of a different wavelength. In another embodiment, there may be a single light source 112 which produces a beam of light which is split (e.g., by a beam splitter) and each of the split beams may be incident on the substrate at a different angle. In some embodiments, the beams of light that are incident on the substrate may have different wavelengths as well as different angles of incidence. In either case, the thickness mapping device 111 may obtain a second set of intensity values associated with at least some of the one or more locations of the substrate. The fourth beam of light may be caused by interaction of the third beam of light with the substrate and may (similarly to the second beam) be a reflected beam or a transmitted beam. To resolve a possible ambiguity regarding whether the thickness is increasing or decreasing, the thickness mapping device may determine and output the profile based on both the first set of intensity values and the second set of intensity values, e.g., $I_3=f(d_1;\lambda_2,\theta_2)$ and $I_4=f(d_2;\lambda_2,\theta_2)$.

Figure 2A:
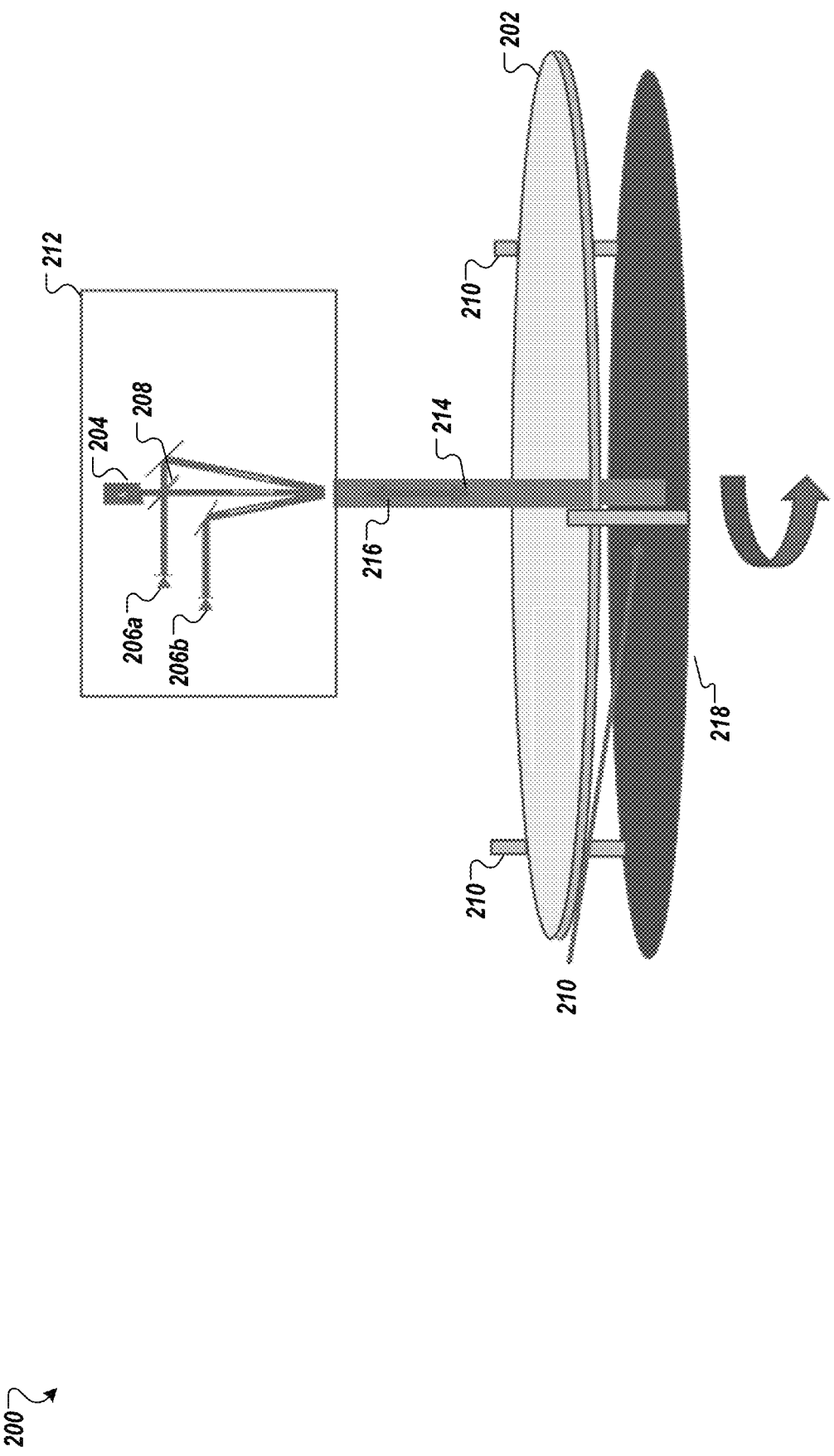
FIG. 2A illustrates a small-spot scanning interferometric system with a single light source for mapping thickness variations of a substrate, according to one embodiment.

FIG. 2A illustrates a small-spot scanning interferometric system 200 with a single light source 204 for mapping thickness variations of a substrate 202 according to one embodiment. The interferometric system 200 may include a light source 204, detector 206, and a beam splitter 208. In some embodiments, the thickness variation mapping setup may include an optical head 212, which combines one or more of the light sources 204, detectors 206, and beam splitters 208. The substrate may be supported with lift pins 210. The pins 210 may be used for edge handling of the substrate 202. In some embodiments, the substrate may be a silicon carbide (SiC) wafer.

The substrate 202 may be illuminated by an incident beam 214 of light (or other forms of electromagnetic radiation), and a reflected beam 216 may be generated upon interaction of the incident beam 214 with the substrate. In some embodiments, the incident beam 214 may be a collimated beam, a focused beam, a coherent beam, a polarized beam, a pulsed beam, or some other beam of beam. An intensity of the reflected beam 216 may display (e.g., as a function of the substrate thickness) a number of bright and dark fringes caused by constructive and destructive interference, respectively, of multiple internal reflections of the beam within the substrate 202. As the incident beam 214 is moved relative to the substrate 202 (or the substrate 202 is being transported relative to the incident beam 214), even small variations in the thickness of the substrate may lead to a sequence of alternating fringes—peaks and valleys/troughs—in the intensity of the reflected (or transmitted) beam.

A spatial frequency of alternating peaks/valleys (e.g., inverse lateral distance between adjacent fringes) may be determined by a variation of thickness of the substrate 202 (e.g., a tangent of the angle that the surface makes with a horizontal direction), the wavelength of the incident beam of light, and the angle of incidence of the beam of light on the substrate. Thus, by scanning the substrate 202 with a beam of light with a known frequency and a known angle of incidence, a thickness profile of the substrate can be mapped. For example, the substrate 202 may be scanned in various ways. In one embodiment, the substrate 202 may be rotated and radially translated such that the full surface of the substrate 202 is scanned in a spiral trace. In other embodiments, the substrate 202 may be fixed while the optical head 212 is rotated in a spiral pattern such that the full surface of the substrate 202 is scanned. In other embodiments, the substrate 202 may be raster scanned by moving one or more of the substrate 202 or the optical head 212 in a rectangular pattern.

As shown in FIG. 2A, the optical head 212 may include a light source 204 which emits a beam of light at a wavelength 2. The beam of light may be split into a first beam of light and a second beam of light, each with wavelength 2. The first beam of light may be incident on the substrate 202 at a first angle of incidence and may interact with the substrate 202. A first detector 206a may detect a first set of intensity values associated with a third beam of light caused by the first beam of light interacting with the substrate 202. Each intensity value may be associated with a set of locations on the substrate 202, according to the selected scanning pattern (e.g., spiral, rectangular, etc.). Similarly, the second beam of light may be incident on the substrate 202 at a second angle of incidence and may interact with the substrate 202. A second detector 206b may detect a second set of intensity values associated with a fourth beam of light caused by the third second beam of light interacting with the substrate 202. Each intensity value may be associated with one of the set of locations on the substrate 202, according to the selected scanning pattern. The first set of intensity values and/or the second set of intensity values may then be used to determine a thickness profile data of the substrate 202.

In some embodiments, where light reflected from the substrate 202 is detected, an absorber 218 may be positioned opposite (e.g., under) to the substrate 202, to prevent (or minimize) light transmitted through the substrate from reflecting back onto the substrate and affecting the substrate reflectance data obtained by detectors 206a and 206b. The absorber 218 may include specialized anti-reflective material to prevent light from interacting with underlying substrate support. Additionally or alternatively, a back side of the substrate may include specialized anti-reflective material to prevent light from interacting with underlying substrate support.

Figure 2B:
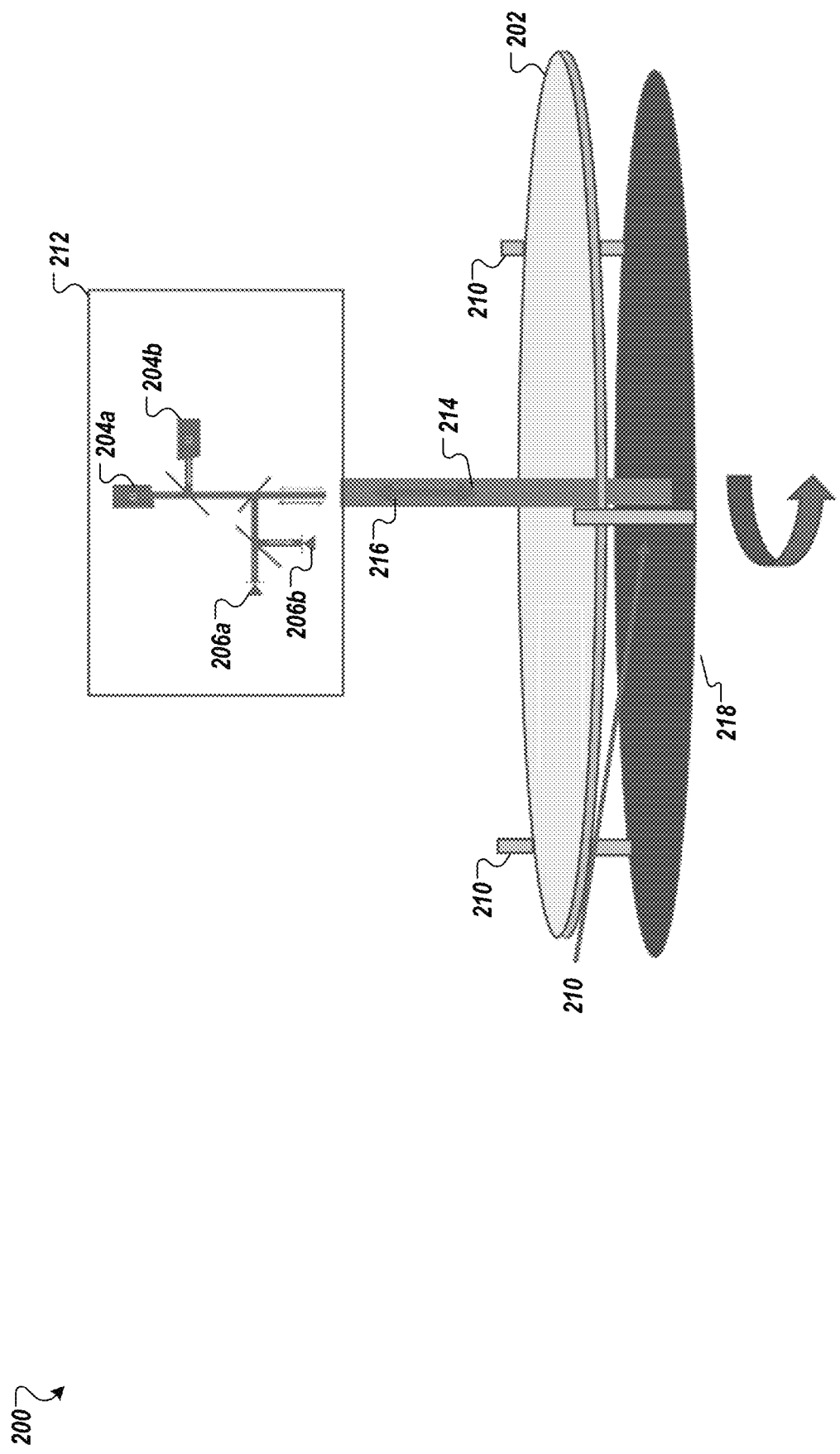
FIG. 2B illustrates a small-spot scanning interferometric system with two light sources and for mapping thickness variations of a substrate, according to one embodiment.

FIG. 2B illustrates a small-spot scanning interferometric system 200 with two light sources 204a and 204b for mapping thickness variations of a substrate 202 according to one embodiment. The small-spot scanning interferometric system 200 of FIG. 2B may be similar to the small-spot scanning interferometric system 200 of FIG. 2A, but may have an optical head that includes multiple (two or more) light sources.

As shown in FIG. 2B, the optical head 212 may include a first source of light 204a and a second source of light 204b which may emit beams of light with a first wavelength $\lambda_1$ and a second wavelength $\lambda_2$. The first beam of light may be incident on the substrate 202 at a given angle of incidence (e.g., normal or other small angle) and may interact with the substrate 202. A first detector 206a may detect a first set of intensity values associated with a third beam of light caused by the first beam of light interacting with the substrate 202. Each intensity value may be associated with one of a set of locations on the substrate 202, according to the scanning pattern. Similarly, the second beam of light may be incident on the substrate 202 at the given angle of incidence and may interact with the substrate 202. A second detector 206b may detect a second set of intensity values associated with a fourth beam of light caused by the second beam of light interacting with the substrate 202. Each intensity value may be associated with the set of locations on the substrate 202 according to the scanning. The first set of intensity values and the second set of intensity values may be used to determine a thickness profile data of the substrate 202.

Figure 2C:
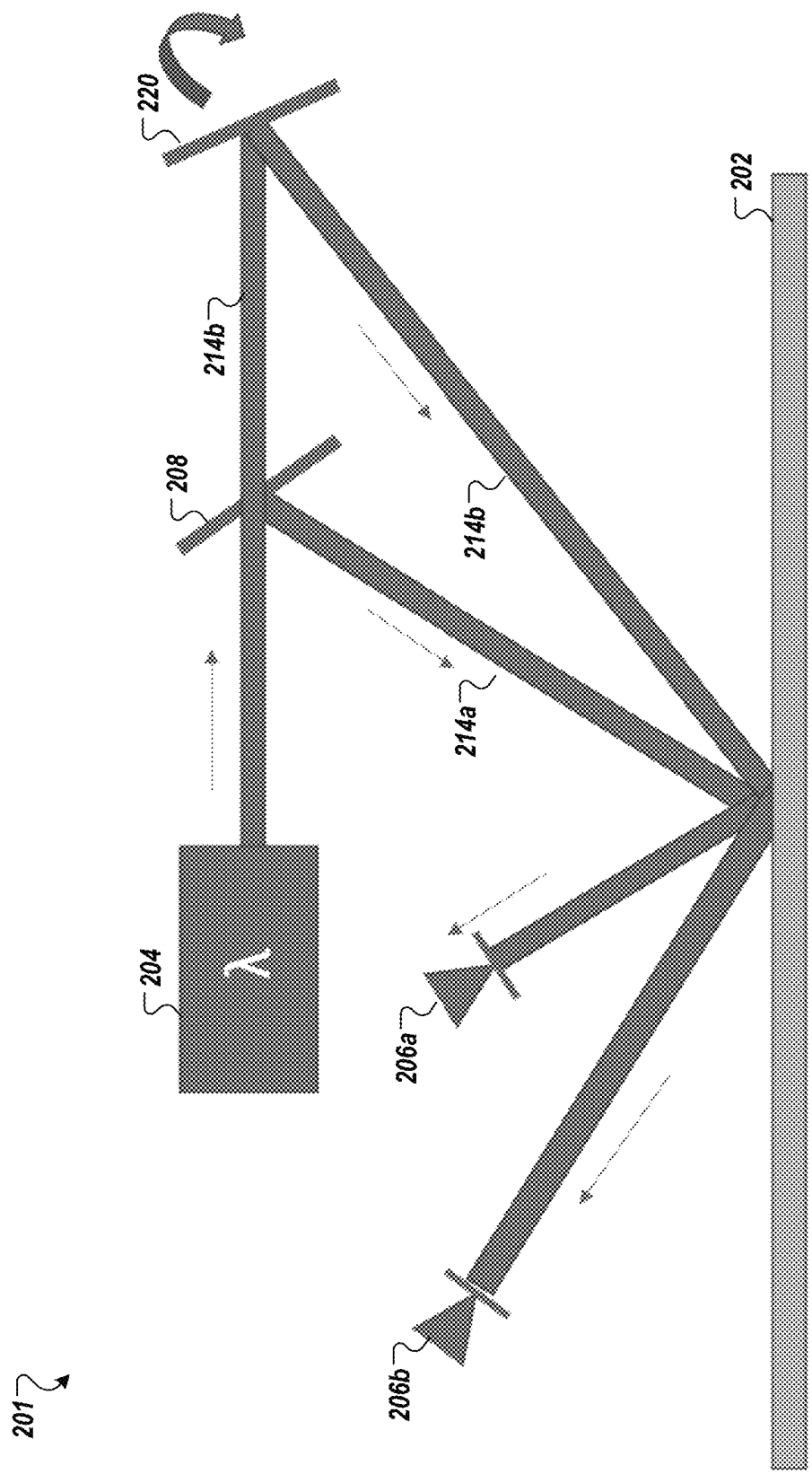
FIG. 2C illustrates a small-spot scanning interferometric system with a single light source and a movable mirror for mapping thickness variations of a substrate, according to one embodiment.

FIG. 2C illustrates a small-spot scanning interferometric system 201 with a single light source 204 and a movable mirror for mapping thickness variations of a substrate 202, according to one embodiment. The small-spot scanning interferometric system 201 may be similar to the small-spot scanning interferometric system 200 of FIGS. 2A-2B as noted by similar reference numbers. As shown in FIG. 2C, a beam of light from light source 204 may be directed towards a beam splitter 208. The beam splitter 208 splits the beam of light into a first incident beam of light 214a and a second incident beam of light 214b. The first incident beam of light 214a may be incident on the substrate 202 (e.g., a sample) with a first angle of incidence. The second incident beam of light 214b on the sample may be directed toward the sample by a mirror 220. The mirror 220 may be tilted by an angle to set a second angle of incidence of the second incident beam of light 214b on the sample. In some embodiments, the mirror 220 may be mounted on a tilting stage, and thus a change in the tilt may alter the angle of incidence of the second beam of light 214b. Referring to equation (2) (introduced below), the internal reflection angle, β, is related to the incidence angle on the sample, α, through Snell's law:

$n \sin β = \sin α$.

Thus, a slight change in α will result in a change in the internal reflection angle. This, in turn, results in a shift in the position of the fringes, as per equation (1) (introduced below). Accordingly, the position of the fringes may be tuned or altered by making minute changes to the angle of incidence. Such small alterations to the angle of incidence will make only negligible changes to the position of the beam on the substrate 202. This allows for the ability to resolve ambiguity in thickness variations. For example, if the variations in the thickness of the substrate 202 are such that the signal in the plateau region of the thickness (i.e. locations where the signal does not change as a function of the position on the sample) be at a maximum or minimum for both angles of incidence, by shifting the angle of incidence of one beam slightly, the simultaneity of the two signals being at a maximum or minimum is broken, thus resolving the ambiguity condition. Slight changes in the angle of incidence may be readily achieved by using a piezo-mounted mirror, as an example.

In some embodiments, the small-spot scanning interferometric systems 200 and 201 may be combined with a mass metrology system to perform a cross check of deposition and etch processes. For example, the mass metrology system may provide information regarding a total mass change of the substrate due to a processing operation (without providing any spatial information), while the thickness variation profile may indicate regions of non-uniform thickness due to the processing operation. In such a way determining the thickness variation profile can be used as feed-forward or feedback mechanisms for an additive or subtractive process.

Figure 3:
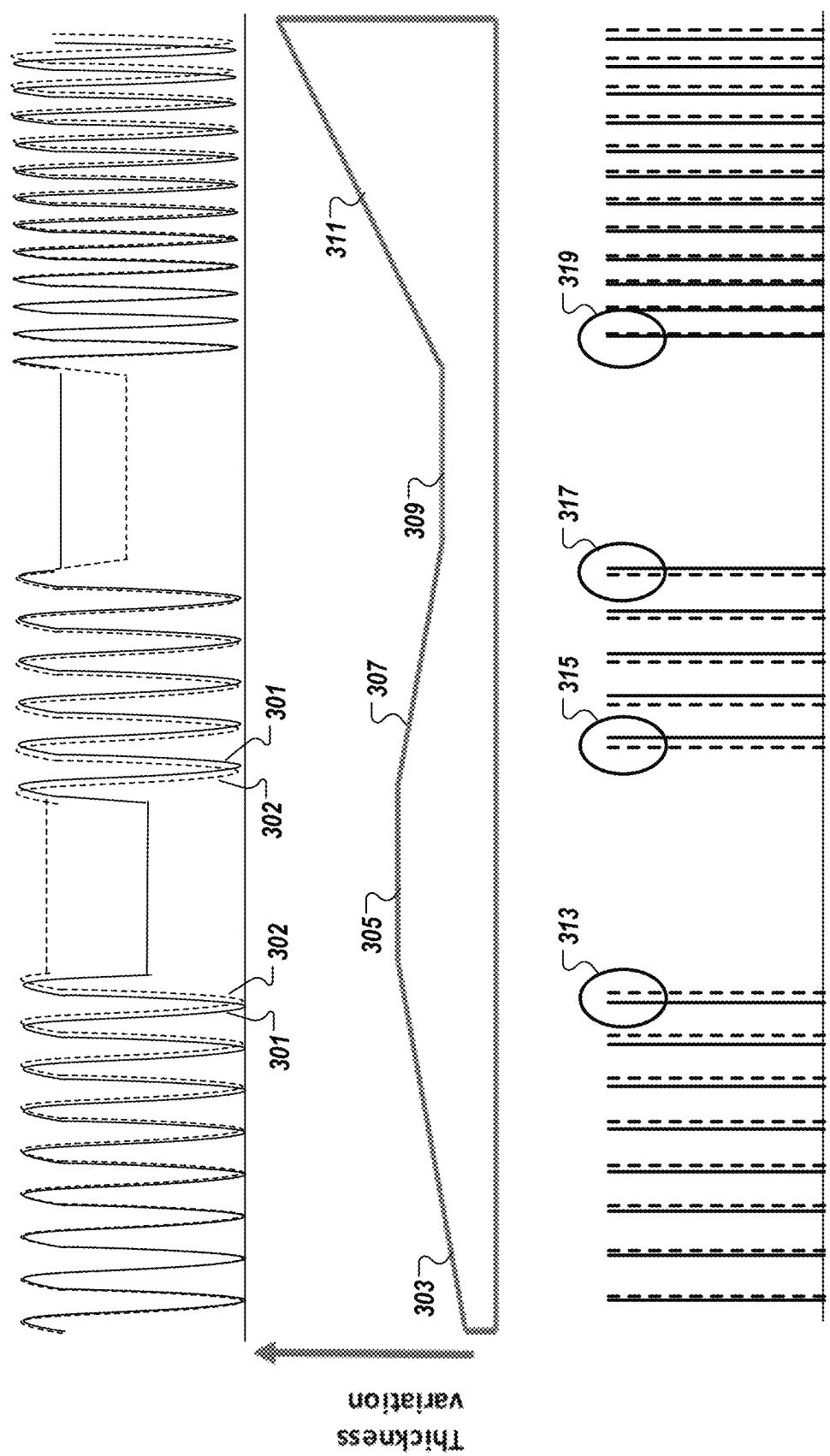
FIG. 3 depicts schematically and interference fringes for scanning using two light beams over regions of a substrate with thickness variations, according to one embodiment.

FIG. 3 depicts schematically intensity values and interference fringes for scanning using two light beams over regions of a substrate with thickness variations according to one embodiment. Making the assumption that the substrate is illuminated from the top with coherent, collimated radiation, a reflected response may appear as a number of parallel fringes.

For example, the intensity of the fringes may be given by $$I_r = I_0 \left\{ 1 - \frac{1}{1 + \left[\frac{2r^2}{(1-r^2)}\right]^2 \sin^2\left(\frac{\theta}{2}\right)} \right\} \quad (1)$$

where $$\theta = \frac{4\pi h(x, y) n \cos(\beta)}{\lambda} \quad (2)$$

and where β is the angle of internal reflection with respect to the surface normal, h(x,y) is the local thickness, λ is the wavelength of light in a vacuum, $I_0$ is the intensity of light incident on the substrate, n is the refractive index of the material, and $r^2$ is the surface reflectance.

For a given light beam, the spatial frequency of the interference fringes may be determined by the slope of the thickness variation, the angle of incidence, and the wavelength. For example, a dark fringe in reflectance may be encountered at points (x,y) of the substrate for which θ=0, 2π, 4π . . . . Accordingly, different dark fringes in reflectance may correspond to locations of the substrate whose thickness differs by an integer number of Δh=λ/(2n·cos β). Maxima of reflectance, correspondingly, are encountered at those locations where substrate thickness differs by ±Δh/2 from the thickness at locations where the reflectance has dark fringes (minima). Thus a substrate may be scanned with a first (incident) beam of light, and a second (reflected or transmitted) beam of light corresponding to interaction of the first beam of light with the substrate may be detected. A first set of intensity values, associated with the second beam of light and corresponding to various locations on the substrate, may be obtained (e.g., using detectors 206). The first set of intensity values may be used to determine profile data characterizing thickness variation h(x,y) of the substrate.

In particular, the intensity values may include a first intensity value $I(x_1,y_1)$ for a first location and a second intensity value $I(x_2,y_2)$ for a second location. The first intensity value and the second intensity value may be used to determine a change Δh in the thickness of the substrate between the first location and the second location. However, as described above, there may exist some ambiguity as to whether the thickness is increasing or decreasing after a plateau in some cases, in particular, where reflection (or transmission) at the plateau is near a maximum or minimum.

A plateau may be identified based on a subset of the first set of intensity values being equal. It should be understood that two substrate thicknesses $h_1$ and $h_2$ may still be considered equal if the difference $|h_1-h_2|\delta h$ is within a target accuracy $\delta h$. The target accuracy $\delta h$ may refer to a desired precision of the manufacturing process. In some embodiments, target accuracy $\delta h$ may refer to a resolution of the optical inspection system. For example, if the resolution of the optical inspection system is $\delta h_r$, locations where $|h_1-h_2|<\delta h_r$ may be considered as having equal thickness.

In some instances, a plateau of equal (in the above sense) thickness may be close to with a particular thickness where reflectance or transmittance has maximum or minimum. As the thickness changes, the reflectance or transmittance may, respectively, decrease or increase regardless of whether the thickness of the substrate is increasing or decreasing. To resolve such an ambiguity, an additional scanning may be performed with an additional beam having a different angle of incidence and/or a different wavelength. Generally, even if the reflectance or transmittance of the first beam is at a peak or trough on the plateau, the additional beam is not near its maximum or minimum (given that the additional beam has a different angle of incidence and/or wavelength). The additional beam may, therefore, serve as a disambiguating benchmark to which the reflectance/transmittance of the first beam is compared.

More specifically, the substrate may be scanned with an additional beam of light (e.g., a third beam of light). The third beam of light may be different from the first beam of light in at least one of a wavelength $\lambda_2$ or an angle of incidence on the substrate $\theta_2$. A fourth beam of light corresponding to interaction of the third beam of light with the substrate may be detected. A second set of intensity values corresponding to various locations on the substrate may be obtained that are associated with the fourth beam of light. The second set of intensity values may be used to further determine profile data characterizing thickness variation of the substrate. Because the first beam of light and the third beam of light have different wavelengths and or incident angles (leading to different internal reflection angles), the resulting intensity fringes due to the first beam of light and the third beam of light are different. This provides the capability to remove the ambiguity of whether the thickness is increasing or decreasing following scanning of a plateau.

For example, when the scanning is performed in the direction of increasing thickness, maxima or minima of the intensity of the second beam (e.g., reflected $\lambda_1$, $\theta_1$ light) are encountered with a different (spatial) frequency than maxima and minima of the intensity of the fourth beam (e.g., reflected $\lambda_2$, $\theta_2$ light). As shown in FIG. 3, in a first region 303 of the positive slope the interference fringes 301 resulting from scanning with the first beam of light (solid lines) are shifted to the left relative to the interference fringes 302 resulting from scanning with the third beam of light (dashed lines). In a second region 305, the slope is zero (a plateau region) and the intensity for both beams remains uniform. In a third region 307, the slope is negative and the relative spatial order between the interference fringes 301 and the interference fringes 302 is reversed (with interference fringes 301 shifted to the right). For example, interference fringes 313 and interference fringes 315 indicate opposite slopes due to a reversal of the relative order of the fringes from scanning with the first beam of light and the third beam of light. In a fifth region 311, past another plateau in a fourth region 309, the slope is once again positive and the relative spatial order of the interference fringes 301 and 302 is reversed compared with the third region 307. As depicted, interference fringes 317 and interference fringes 319 indicate opposite slopes due to a reversal of the relative order of the fringes from scanning with the first beam of light and the third beam of light. In a similar way, the interference fringes 313 and the interference fringes 319 have the same relative order indicating that the slopes in the first region 303 and the fifth region 311 are the same (e.g., positive).

Figure 4:
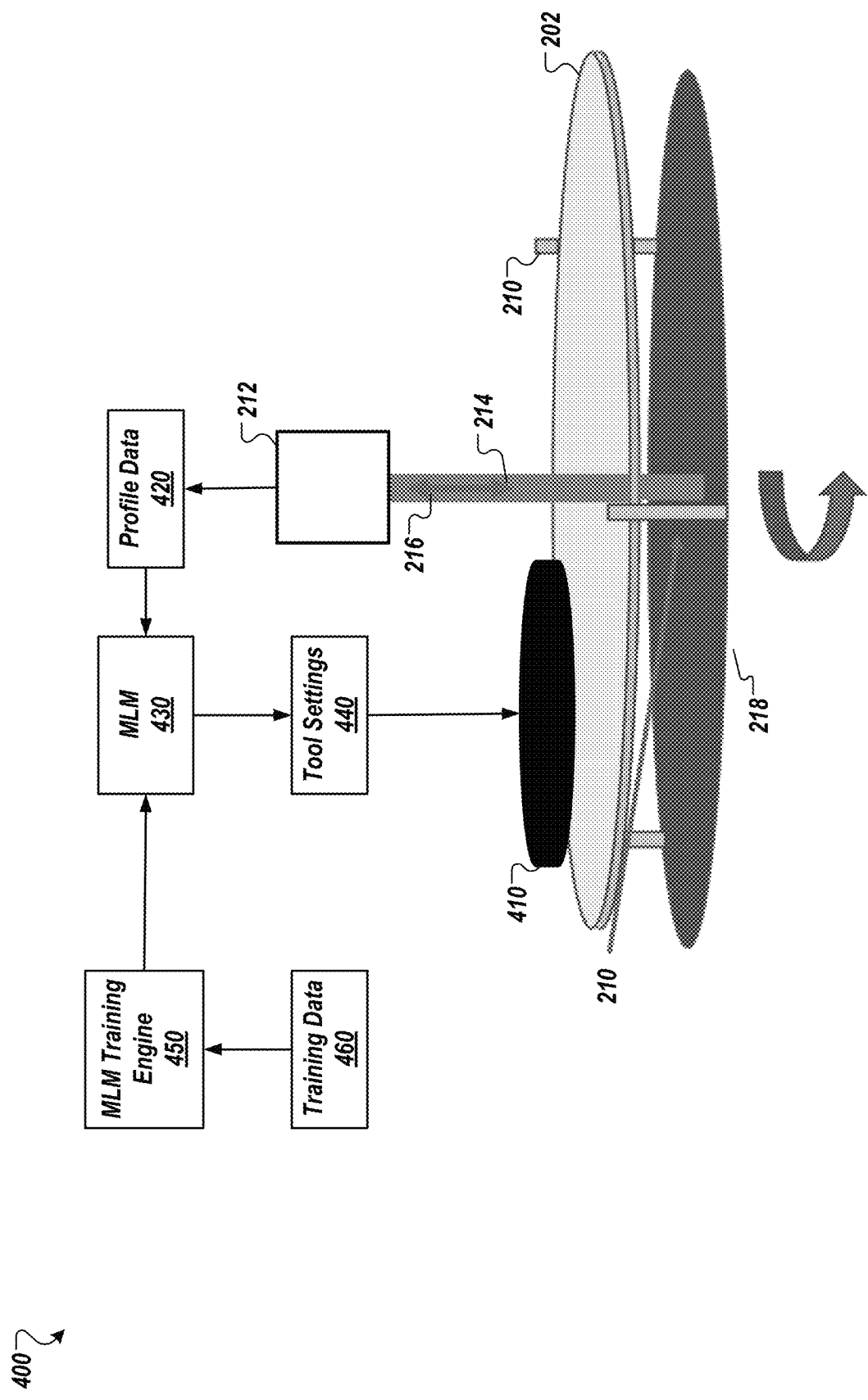
FIG. 4 illustrates integration of machine-learning methods of manufacturing process control with optical inspection metrology, according to one embodiment.

FIG. 4 illustrates integration of machine-learning methods of manufacturing process control with optical inspection metrology, according to one embodiment. Depicted in FIG. 4 is substrate 202 being processed by a process tool 410 that can be a CMP (or some other polishing device). A metrology device, e.g., optical head 212 (or some other measurement device), may monitor a real-time state of substrate 202. For example, optical head 212 may determine thickness and profile of substrate 202 while process tool 410 changes the state of substrate, e.g., by removing material from substrate 202. Profile data 420 output by optical head 212 may be processed by one or more machine-learning models 430 (MLM). MLM 430 may be or include a decision-tree algorithm, a support vector machine, a deep neural network, or any combination thereof. Deep neural networks may include convolutional neural networks, recurrent neural networks (RNN) with one or more hidden layers, fully connected neural networks, long short-term memory neural networks, Boltzmann machines, and so on. MLM 430 may be trained to implement a specific technological process, including a specific substrate profile to be created over a specific time, a particular quality of the surface of substrate to be achieved, and so on. MLM 430 may use, as inputs, a profile data 420, specification of the technological process (not shown), a current timestamp (e.g., counted from the beginning of the technological process), and other suitable data. MLM 430 may output (e.g., in real time) tool settings 440 for the process tool 410. Tool settings may include pressure exerted by process tool 410 on substrate 202, a rate of removal of material from substrate 202, speed of rotation of process tool 410, or any other applicable tool settings 440. As the processing by process tool 410 continues, tool settings 440 may change accordingly. For example, as a target profile is being approached, MLM 430 may output tool settings 440 that slow down the rate of material removal, ease pressure on the substrate, and so on.

In some implementations, the metrology device (e.g., optical head 212) monitors the state of substrate 202 continuously (e.g., by moving over substrate 202 in a predetermined pattern). In some implementations, the metrology device may monitor the state of substrate 202 periodically, at specific times, and the like.

MLM 430 may be trained by MLM training engine 450. Training engine 450 may be located on the same manufacturing machine that hosts process tool 410 and the metrology device, or on some external server that is communicatively coupled to the manufacturing machine. In some implementations, MLM training engine 450 may be located on a server that does not interact with the manufacturing machine, with the trained MLM being installed on the manufacturing machine after the training is performed. MLM training engine 450 may use training data 460, which may include data related to substrates of a similar type and processed in a similar (or the same) technological process. For example, training data 460 may include dynamic profile data as well as tools settings implemented during previous processing of similar wafers. Training data 460 may further include annotations indicating correct and incorrect processing. In some implementations, MLM training engine 450 may train MLM 430 in real time on the same manufacturing machine that hosts process tool 410, e.g., using self-directed training iterations on a single (or multiple) batches of substrates.

Figure 5:
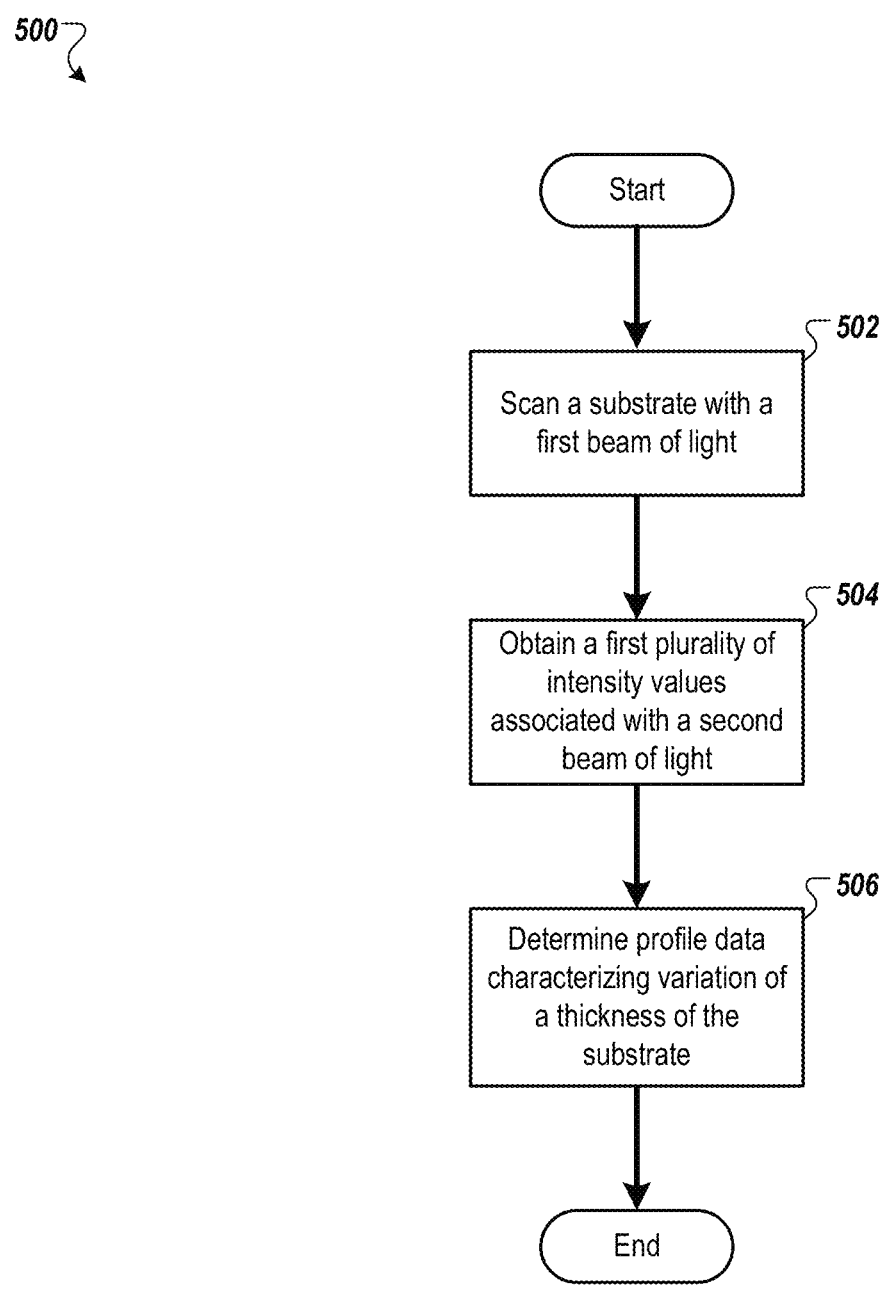
FIG. 5 is a flow diagram of a method of mapping thickness of a substrate, according to one embodiment.

FIG. 5 is a flow diagram of a method 500 of mapping thickness of a substrate according to one embodiment. The method 500 may be performed using systems and components shown in FIG. 1 and FIGS. 2A-2B or some combination thereof. Method 500 may be performed using a single light sensor or a plurality of light sensors. The light sensors may be configured for scanning a substrate as depicted in FIGS. 2A-2B. Some or all blocks of the method 500 may be performed responsive to instructions from the computing device 118 or the microcontroller 152, in some embodiments. The microcontroller 152 may include one or more processing devices, such as central processing units (CPUs), application-specific integrated circuits (ASICs), field programmable gate arrays (FPGAs), digital signal processors (DSPs), network processors, or the like. The processing device(s) is (are) communicatively coupled to one or more memory devices, such as read-only memory (ROM), flash memory, static memory, dynamic random access memory (DRAM), and the like. The microcontroller 152 can be a part of a desktop computer, a laptop computer, a workstation, a wearable device (e.g., a tablet, a smart phone, etc.), a cloud-based computing service, and the like. In some embodiments, the microcontroller 152 is a part of a larger network of computing devices. In some embodiments, an outside computing device communicating with the microcontroller 152 is capable of reconfiguring (e.g., changing settings, updating memory, or otherwise reprogramming) the microcontroller 152. In some embodiments, the thickness mapping method 500 may be performed while a wafer is present inside a processing chamber. In some embodiments, the method 500 may be implemented once a wafer has been removed from a processing chamber. The thickness mapping method may be performed under conditions (e.g., at pressures and temperatures) that are similar to the actual conditions of the processing chamber during the manufacturing process. Accordingly, the manufacturing process may occur at low temperatures, or at temperatures that are less or significantly less than the room temperature. Alternatively, the manufacturing process may occur at the room temperature, above the room temperature, or significantly above it. In some embodiments, the pressure inside the chamber may be less or significantly less than the atmospheric pressure, including low vacuum or high vacuum conditions.

The method 500 may include scanning a substrate with a first beam of light (block 502). The first beam of light may be emitted from a laser, a narrow-band light source, a wideband light source whose spectral distribution is subsequently narrowed, a spectrally narrowed light emitting diode and so on. The first beam of light may have a first wavelength and be incident on the substrate at a first angle. Scanning the substrate may include moving the first beam of light relative to the substrate. In some embodiments, the sources (and detectors) of light are stationary (e.g., relative to the substrate processing system) but the substrate is moving. For example, the substrate may be transported under the sources (and detectors) of light while the scanning is performed. In some embodiments, the first beam of light is moved in a spiral pattern relative to the substrate. In other embodiments, the first beam of light is moved relative to the substrate in a rectangular pattern, zigzag pattern, or any other geometric pattern.

The method 500 may continue with obtaining, for each of a set of locations of the substrate, a respective one of a first set of intensity values associated with a second beam of light (block 504). The second beam of light may be caused by interaction of the first beam of light with the substrate. The first set of intensity values associated with the second beam of light may include at least a first intensity value for a first location of the set of locations and a second intensity value for a second location of the set of locations. In one embodiment, the second beam of light is a reflected beam caused by interaction of the first beam of light with the substrate, and each of the first set of intensity values is associated with a reflectivity of the substrate at a respective location of the set of locations of the substrate. In another embodiment, the second beam of light is a transmitted beam caused by interaction of the first beam of light with the substrate, and each of the first set of intensity values is associated with a transmissivity of the substrate at a respective location of the set of locations of the substrate.

The method 500 may continue with determining profile data characterizing variation of a thickness of the substrate (block 506). Determining the profile data may be based on using the first set of intensity values and may correspond to determining a change in the thickness of the substrate between the first location and the second location using the first intensity value and the second intensity value; the method 500 ends.

In further embodiments, the method 500 may further include scanning the substrate with a third beam of light. The third beam of light may be different from the first beam of light in at least one of a wavelength or an angle of incidence of the beam of light on the substrate. In further embodiments, the method 500 may further include obtaining, for at least some of the locations of the substrate, a respective one of a second plurality of intensity values associated with a fourth beam of light. The fourth beam of light may be caused by an interaction of the third beam of light with the substrate, and determining the profile data may be further based on the second set of intensity values.

The second set of intensity values associated with the fourth beam may identify a third group of interference fringes for the first region of the substrate and a fourth group of interference fringes for the second region of the substrate. In some embodiments, determining the profile data further includes identifying that a relative spatial order of the first group of interference fringes and the third group of interference fringes is different from a relative spatial order of the second group of interference fringes and the fourth group of interference fringes. Using the identified relative spatial order of the interference fringes, it may be determined that the thickness of the substrate is either increasing in a direction of scanning (e.g., in the first region) and decreasing in the direction of scanning (e.g., in the second region), or vice versa.

Scanning the substrate may include moving at least one of the first beam of light or the third beam of light in a spiral pattern relative to the substrate. In other embodiments, scanning the substrate may include moving the substrate in a spiral pattern relative to at least one of the first beam of light or the third beam of light. In some embodiments, scanning the substrate may include scanning in other patterns other than spiral, for example in a raster scanning pattern.

In some embodiments, if it is determined that a subset of the first set of intensity values are substantially equal (e.g., equal within a target accuracy value), it may be determined that the thickness of a region of the substrate is uniform.

In some embodiments, for example CMP residual water may remain on the substrate. To improve accuracy of thickness mapping, a portion of the substrate may be dried (or cleaned) with a flow of gas (such as nitrogen, argon, xenon, air, or the like) prior to scanning.

In some embodiments, the thickness of the substrate may be modified (either increased (e.g., by additional deposition by a deposition device) or decreased (e.g., etched using an etching device, or polished using a polishing device), or otherwise adjusted) in view of the determined thickness profile data. In some embodiments, the substrate is a SiC wafer may be adjusted by varying device control parameters. The control parameters may determine the speed or amount of a material that is added to (or removed from) the substrate.

The systems and methods disclosed herein may be used not only for thickness variation monitoring during manufacturing, but may also be utilized for testing and development of various deposition and polishing processes. The advantages of the disclosed embodiments include, but are not limited to, the ability to inspect quality of processes and uniformity of substrate surfaces and so on.

Figure 6:
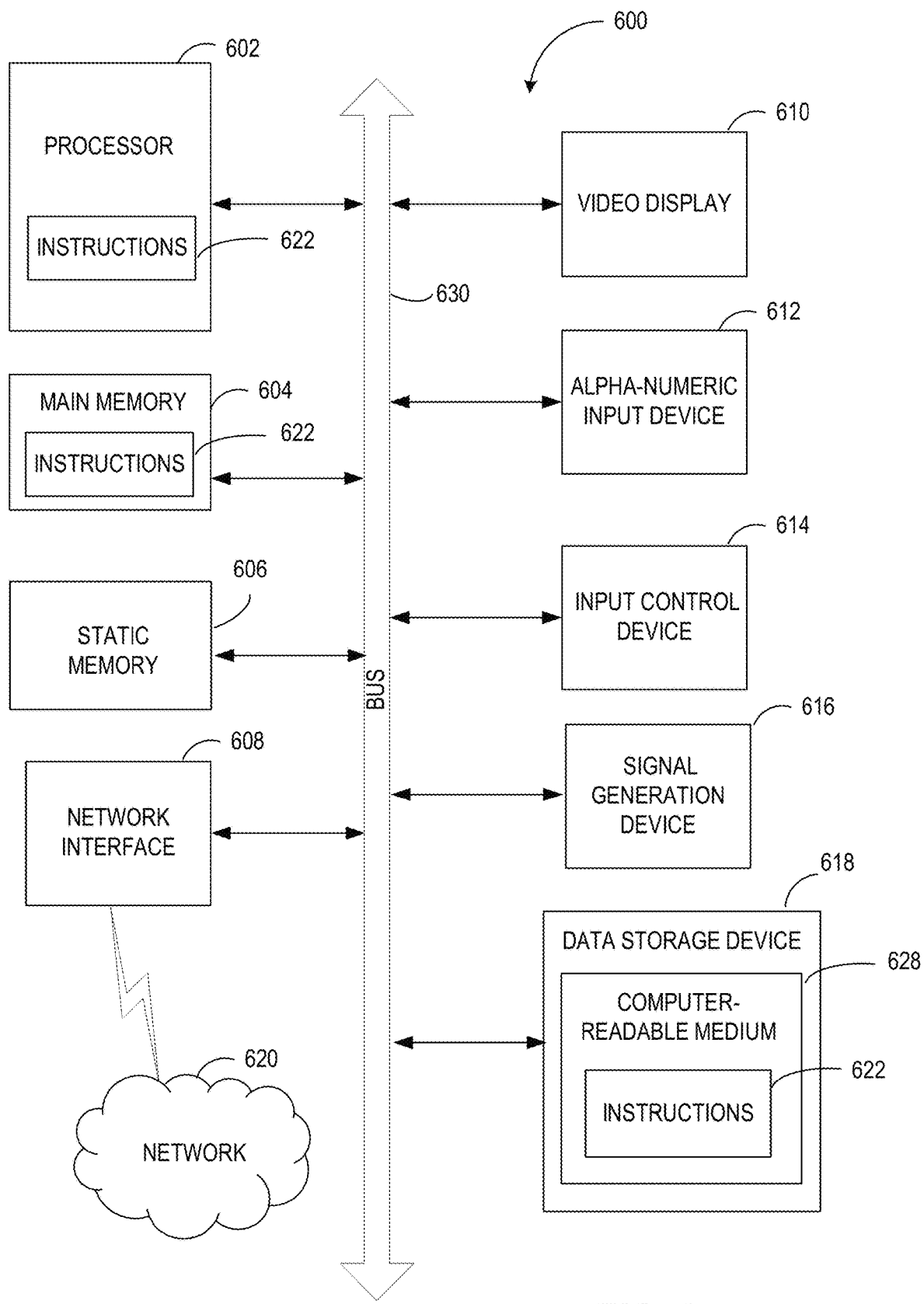
FIG. 6 depicts a block diagram of an example processing device operating in accordance with one or more aspects of the present disclosure.

FIG. 6 depicts a block diagram of an example processing device 600 operating in accordance with one or more aspects of the present disclosure. The processing device 600 may be the computing device 118 of FIG. 1.

Example processing device 600 may be connected to other processing devices in a local area network (LAN), an intranet, an extranet, and/or the Internet. The processing device 600 may be a personal computer (PC), a set-top box (STB), a server, a network router, switch or bridge, or any device capable of executing a set of instructions (sequential or otherwise) that specify actions to be taken by that device. Further, while only a single example processing device is illustrated, the term "processing device" shall also be taken to include any collection of processing devices (e.g., computers) that individually or jointly execute a set (or multiple sets) of instructions to perform any one or more of the methods discussed herein.

Example processing device 600 may include a processor 602 (e.g., a CPU), a main memory 604 (e.g., read-only memory (ROM), flash memory, dynamic random access memory (DRAM) such as synchronous DRAM (SDRAM), etc.), a static memory 606 (e.g., flash memory, static random access memory (SRAM), etc.), and a secondary memory (e.g., a data storage device 618), which may communicate with each other via a bus 630.

Processor 602 represents one or more general-purpose processing devices such as a microprocessor, central processing unit, or the like. More particularly, processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. In accordance with one or more aspects of the present disclosure, processor 602 may be configured to execute instructions implementing method 500 of thickness variation mapping.

Example processing device 600 may further comprise a network interface device 608, which may be communicatively coupled to a network 620. Example processing device 600 may further comprise a video display 610 (e.g., a liquid crystal display (LCD), a touch screen, or a cathode ray tube (CRT)), an alphanumeric input device 612 (e.g., a keyboard), an input control device 614 (e.g., a cursor control device, a touch-screen control device, a mouse), and a signal generation device 616 (e.g., an acoustic speaker).

Data storage device 618 may include a computer-readable storage medium (or, more specifically, a non-transitory computer-readable storage medium) 628 on which is stored one or more sets of executable instructions 622. In accordance with one or more aspects of the present disclosure, executable instructions 622 may comprise executable instructions implementing method 500 of thickness variation mapping.

Executable instructions 622 may also reside, completely or at least partially, within main memory 604 and/or within processor 602 during execution thereof by example processing device 600, main memory 604 and processor 602 also constituting computer-readable storage media. Executable instructions 622 may further be transmitted or received over a network via network interface device 608.

While the computer-readable storage medium 628 is shown in FIG. 6 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

It should be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

The embodiments of methods, hardware, software, firmware or code set forth above may be implemented via instructions or code stored on a machine-accessible, machine readable, computer accessible, or computer readable medium which are executable by a processing element. "Memory" includes any mechanism that provides (i.e., stores and/or transmits) information in a form readable by a machine, such as a computer or electronic system. For example, "memory" includes random-access memory (RAM), such as static RAM (SRAM) or dynamic RAM (DRAM); ROM; magnetic or optical storage medium; flash memory devices; electrical storage devices; optical storage devices; acoustical storage devices, and any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment, embodiment, and/or other exemplarily language does not necessarily refer to the same embodiment or the same example, but may refer to different and distinct embodiments, as well as potentially the same embodiment.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such. Also, the terms "first," "second," "third," "fourth," etc. as used herein are meant as labels to distinguish among different elements and may not necessarily have an ordinal meaning according to their numerical designation.

What is claimed is:

1. A method comprising:
   scanning a substrate with a first beam of light;
   obtaining, for each of a plurality of locations of the substrate, a respective one of a first plurality of intensity values associated with a second beam of light, wherein the second beam of light is caused by interaction of the first beam of light with the substrate, and wherein the first plurality of intensity values characterizes one or more spatial interference fringes caused by interference of a first portion of the second beam of light originating at a first surface of the substrate with a second portion of the second beam of light originating at a second surface of the substrate;
   scanning the substrate with a third beam of light, wherein the third beam of light is different from the first beam of light in at least one of a wavelength or an angle of incidence on the substrate;
   obtaining, for each of the plurality of locations of the substrate, a respective one of a second plurality of intensity values associated with a fourth beam of light, wherein the fourth beam of light is caused by interaction of the third beam of light with the substrate, and wherein the second plurality of intensity values characterizes one or more additional spatial interference fringes caused by interference of a third portion of the third beam of light originating at the first surface of the substrate with a fourth portion of the fourth beam of light originating at the second surface of the substrate; and
   determining, using the first plurality of intensity values and the second plurality of intensity values, profile data characterizing variation of a thickness of the substrate.

2. The method of claim 1, wherein the first plurality of intensity values associated with the second beam of light comprises:
   a first intensity value for a first location of the plurality of locations, and
   a second intensity value for a second location of the plurality of locations, and
   wherein determining the profile data comprises:
      determining a change in the thickness of the substrate between the first location and the second location using the first intensity value and the second intensity value.

3. The method of claim 1, wherein the profile data characterizing variation of a thickness of the substrate determines:
   a magnitude of a change of the thickness of the substrate between a first region of the substrate and a second region of the substrate; and
   a sign of the change of the thickness.

4. The method of claim 1, wherein the first plurality of intensity values identifies:
   a first group of interference fringes for a first region of the substrate, and
   a second group of interference fringes for a second region of the substrate, and
   wherein the second plurality of intensity values identifies:
      a third group of interference fringes for a first region of the substrate, and
      a fourth group of interference fringes for a second region of the substrate, and
   wherein determining the profile data comprises:
      identifying that a relative spatial order of the first group of interference fringes and the third group of interference fringes is different from a relative spatial order of the second group of interference fringes and the fourth group of interference fringes; and
      determining, based on the identifying, that the thickness of the substrate is increasing, in a direction of scanning, in the first region, and decreasing, in the direction of scanning, in the second region.

5. The method of claim 3, wherein scanning the substrate comprises moving at least one of the first beam of light or the third beam of light in a spiral pattern relative to the substrate.

6. The method of claim 1, wherein the second beam of light is a reflected beam caused by interaction of the first beam of light with the substrate, and wherein each of the first plurality of intensity values is associated with a reflectivity of the substrate at a respective location of the plurality of locations of the substrate.

7. The method of claim 1, wherein the second beam of light is a transmitted beam caused by interaction of the first beam of light with the substrate, and wherein each of the first plurality of intensity values is associated with a transmissivity of the substrate at a respective location of the plurality of locations of the substrate.

8. The method of claim 1, further comprising determining that the thickness of a region of the substrate is uniform, based on a subset of the first plurality of intensity values being equal within a target accuracy, wherein each of the subset of the first plurality of intensity values is obtained for the region of the substrate.

9. The method of claim 1, wherein scanning the substrate with the first beam of light comprises:
drying at least a portion of the substrate with a flow of gas.

10. The method of claim 1, further comprising:
modifying, in view of the determined profile data, the thickness of the substrate in at least one region of the substrate.

11. The method of claim 1, wherein the substrate is a silicon carbide (SiC) wafer.

12. A system configured to scan a substrate, the system comprising:
a first light source to emit a first beam of light;
a first optical sensor to obtain, for each of a plurality of locations of the substrate, a respective one of a first plurality of intensity values associated with a second beam of light, wherein the second beam of light is caused by interaction of the first beam of light with the substrate, and wherein the first plurality of intensity values characterizes one or more spatial interference fringes caused by interference of a first portion of the second beam of light originating at a first surface of the substrate with a second portion of the second beam of light originating at a second surface of the substrate;
one or more optical elements to direct a third beam of light to the substrate;
a second optical sensor to obtain, for each of the plurality of locations of the substrate, a respective one of a second plurality of intensity values associated with a fourth beam of light, wherein the second beam of light is caused by interaction of the third beam of light with the substrate, and wherein the second plurality of intensity values characterizes one or more additional spatial interference fringes caused by interference of a third portion of the third beam of light originating at the first surface of the substrate with a fourth portion of the fourth beam of light originating at the second surface of the substrate; and
a processing device configured to determine, using the first plurality of intensity values and the second plurality of intensity values, profile data characterizing variation of a thickness of the substrate.

13. The system of claim 12, wherein the one or more optical elements comprise at least one of:
a second light source to emit the third beam of light; or
a beam splitter to generate the third beam of light by splitting off a portion of the first beam of light.

14. The system of claim 13, wherein the first plurality of intensity values identifies:
a first group of interference fringes for a first region of the substrate, and
a second group of interference fringes for a second region of the substrate, and
wherein the second plurality of intensity values identifies:
a third group of interference fringes for a first region of the substrate, and
a fourth group of interference fringes for a second region of the substrate, and
wherein to determine the profile data, the processing device is configured to:
identify that a relative spatial order of the first group of interference fringes and the third group of interference fringes is different from a relative spatial order of the second group of interference fringes and the fourth group of interference fringes; and
determine, based on the relative spatial order, that the thickness of the substrate is
increasing, in a direction of scanning, in the first region, and
decreasing, in the direction of scanning, in the second region.

15. The system of claim 12, wherein an angle of incidence of the third beam of light on the substrate is different from an angle of incidence of the first beam of light on the substrate.

16. The system of claim 12, wherein a wavelength of the third beam of light is different from a wavelength of the first beam of light.

17. The system of claim 12, wherein the first light source and the first optical sensor are mounted on an optical head, and wherein to scan the substrate, the first beam of light is moved relative to the substrate by moving at least one of the substrate or the optical head.

18. The system of claim 12, further comprising a directed gas source to dry at least a portion of the substrate with a flow of gas.

19. The system of claim 12, further comprising a substrate-processing tool configured to modify the thickness of the substrate, and wherein the processing device is further configured to apply a machine-learning model to the first plurality of intensity values to determine adjusted tool settings for the substrate-processing tool.

20. A system comprising:
a movable stage to support a substrate;
a light source to direct a first beam of light to scan the substrate being transported on the movable stage;
a first optical sensor to obtain, for each of a plurality of locations of the substrate, a respective one of a first plurality of intensity values associated with a second beam of light, wherein the second beam of light is caused by interaction of the first beam of light with the substrate, and wherein the first plurality of intensity values characterizes one or more spatial interference fringes caused by interference of a first portion of the second beam of light originating at a first surface of the substrate with a second portion of the second beam of light originating at a second surface of the substrate;
one or more optical elements to direct a third beam of light to scan the substrate;
a second optical sensor to obtain, for each of the plurality of locations of the substrate, a respective one of a second plurality of intensity values associated with a fourth beam of light, wherein the second beam of light is caused by interaction of the third beam of light with the substrate, and wherein the second plurality of intensity values characterizes one or more additional spatial interference fringes caused by interference of a third portion of the third beam of light originating at the first surface of the substrate with a fourth portion of the fourth beam of light originating at the second surface of the substrate; and
a processing device communicatively coupled to the first optical sensor and the second optical sensor, the processing device to generate, using the first plurality of intensity values and the second plurality of intensity values, profile data characterizing variation of a thickness of the substrate.

21. The system of claim 20, further comprising at least one of a deposition device, an etching device, or a polishing device configured to adjust a thickness of at least one of the plurality of locations of the substrate based on the profile data.

22. The system of claim 21, wherein device control parameters of the at least one of the deposition device, the etching device, or the polishing device are controlled to adjust the thickness of the substrate.

23. The system of claim 21, wherein the polishing device is a chemical-mechanical polishing (CMP) device.

24. The system of claim 20, wherein the movable stage comprises at least one of i) a robot blade or ii) a polishing device capable of adjusting a thickness of at least one of the plurality of locations of the substrate.

* * * * *

UNITED STATES PATENT AND TRADEMARK OFFICE
CERTIFICATE OF CORRECTION

PATENT NO. : 12,276,490 B2
APPLICATION NO. : 17/860335
DATED : April 15, 2025
INVENTOR(S) : Mehdi Vaez-Iravani, Todd J. Egan and Gopalakrishna B. Prabhu It is certified that error appears in the above-identified patent and that said Letters Patent is hereby corrected as shown below:

In the Claims

In Claim 1, Column 18, Line 4, replace "third beam" with "fourth beam"

In Claim 4, Column 18, Line 38, replace "a first" with "the first"

In Claim 4, Column 18, Line 40, replace "a second" with "the second"

In Claim 12, Column 19, Line 35, replace "second beam" with "fourth beam"

In Claim 12, Column 19, Line 40, replace "third beam" with "fourth beam"

In Claim 14, Column 19, Line 60, replace "a first" with "the first"

In Claim 14, Column 19, Line 62, replace "a second" with "the second"

In Claim 20, Column 20, Line 51, replace "second beam" with "fourth beam"

In Claim 20, Column 20, Line 56, replace "third beam" with "fourth beam"

Signed and Sealed this
First Day of July, 2025

Coke Morgan Stewart
*Acting Director of the United States Patent and Trademark Office*